(12) United States Patent
Shin et al.

(10) Patent No.: US 11,781,038 B2
(45) Date of Patent: Oct. 10, 2023

(54) COLOR CONVERSION PANEL AND MANUFACTURING METHOD THEREOF

(71) Applicant: Samsung SDI Co., Ltd., Yongin-si (KR)

(72) Inventors: Dongju Shin, Suwon-si (KR); Seungeun Lee, Suwon-si (KR); Woojin Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 74 days.

(21) Appl. No.: 16/652,980

(22) PCT Filed: Jun. 25, 2018

(86) PCT No.: PCT/KR2018/007168
§ 371 (c)(1),
(2) Date: Apr. 1, 2020

(87) PCT Pub. No.: WO2019/112126
PCT Pub. Date: Jun. 13, 2019

(65) Prior Publication Data
US 2020/0239732 A1    Jul. 30, 2020

(30) Foreign Application Priority Data
Dec. 7, 2017  (KR) .................. 10-2017-0167460

(51) Int. Cl.
*C09D 183/06* (2006.01)
*C08G 77/18* (2006.01)
(Continued)

(52) U.S. Cl.
CPC .......... *C09D 183/06* (2013.01); *C08G 77/18* (2013.01); *C23C 16/345* (2013.01); *C08G 77/70* (2013.01)

(58) Field of Classification Search
None
See application file for complete search history.

(56) References Cited

U.S. PATENT DOCUMENTS 5,580,819 A * 12/1996 Li ........................ G02B 1/111
                                                      428/447
7,071,244 B2   7/2006 Liao
(Continued)

FOREIGN PATENT DOCUMENTS

CN    1797781 A    7/2006
CN    1988875 A    6/2007
(Continued)

OTHER PUBLICATIONS

JP-2004307694 English machine translation (2004).*
(Continued)

*Primary Examiner* — Kenneth J Stachel
(74) *Attorney, Agent, or Firm* — Lewis Roca Rothgerber Christie LLP (57) ABSTRACT

A color conversion panel includes a substrate, a low refractive layer disposed on one surface of the substrate and including a carbosilane-siloxane copolymer, a color conversion layer disposed on the low refractive layer and including a color conversion member and a planarization layer covering the low refractive layer and the color conversion layer, wherein the low refractive layer has a refractive index of less than or equal to 1.30 in a wavelength of 500 nm to 550 nm, and the color conversion member includes a quantum dot, and a manufacturing method thereof is provided.

18 Claims, 2 Drawing Sheets

(51) Int. Cl.
*C08G 77/00* (2006.01)
*C23C 16/34* (2006.01)

(56) References Cited

U.S. PATENT DOCUMENTS

| | | | |
|---|---|---|---|
| 9,051,491 B2 | 6/2015 | Kärkkäinen | |
| 2004/0266923 A1* | 12/2004 | Fehn | C09J 183/04 |
| | | | 524/261 |
| 2008/0188032 A1* | 8/2008 | Rantala | C08L 83/14 |
| | | | 257/E31.119 |
| 2009/0203839 A1 | 8/2009 | Karkkainen | |
| 2010/0110521 A1 | 5/2010 | Kawaguchi et al. | |
| 2010/0252917 A1* | 10/2010 | Karkkainen | G03F 1/46 |
| | | | 257/E23.116 |
| 2015/0124188 A1* | 5/2015 | Kadowaki | G02F 1/133528 |
| | | | 359/851 |
| 2016/0216558 A1 | 7/2016 | Toki et al. | |
| 2017/0309844 A1* | 10/2017 | Saeki | C08G 73/1039 |

FOREIGN PATENT DOCUMENTS

| | | | |
|---|---|---|---|
| CN | 101045347 A | | 10/2007 |
| CN | 101239518 A | | 8/2008 |
| CN | 103112231 A | | 5/2013 |
| CN | 105467759 A | | 4/2016 |
| CN | 107369754 A | | 11/2017 |
| JP | 1-152422 A | | 6/1989 |
| JP | 11228631 A | * | 8/1999 |
| JP | 2004-21036 A | | 1/2004 |
| JP | 2004307694 A | * | 11/2004 ....... H01L 21/02126 |
| JP | 2005-99693 A | | 4/2005 |
| JP | 2008242314 A | * | 10/2008 |
| JP | 2011-504522 A | | 2/2011 |
| JP | WO2013/141318 A1 | | 9/2013 |
| JP | 2013-231877 | | 11/2013 |
| JP | 2014-38702 A | | 2/2014 |
| JP | 2014-123579 A | | 7/2014 |
| JP | 2015-162280 A | | 9/2015 |
| JP | 2016-58638 A | | 4/2016 |
| JP | 2017-97334 A | | 6/2017 |
| KR | 10-2004-0080474 A | | 9/2004 |
| KR | 10-2009-0106277 A | | 10/2009 |
| KR | 10-2011-0039862 A | | 4/2011 |
| KR | 10-2014-0058956 A | | 5/2014 |
| KR | 10-2017-0014755 A | | 2/2017 |
| KR | 10-2017-0075468 A | | 7/2017 |
| TW | 201218207 A1 | | 5/2012 |
| TW | 201616230 A | | 5/2016 |
| TW | 201738639 A | | 11/2017 |
| TW | 201739899 A | | 11/2017 |
| WO | WO 2017/057287 A1 | | 4/2017 |

OTHER PUBLICATIONS

English machine translation JP-2008242314 (2008).*
English machine translation JP2013231877A (2013).*
English machine translation JP2017-097334 (2017).*
CAS Registry No. 917090-25-6 ACS (2022).*
English machine translation JPH11228631 1999 JPO (2013).*
Classification Directory of the Journal of the Chinese Ceramic Society, Dec. 2008, pp. 1803-1832, vol. 36, No. 12, Editorial Department of Journal of the Chinese Ceramic Society, China Academic Journal Electronic Publishing House, China.
Study of Environmental and High Effective Synthetic Method of PCS Precursor for Industrial Production, Preparation Process of Ceramic Matrix Composites, 2014, pp. 86-88, vol. 6, China Academic Journal Electronic Publishing House, China.

* cited by examiner

COLOR CONVERSION PANEL AND MANUFACTURING METHOD THEREOF

CROSS-REFERENCE TO RELATED APPLICATIONS

This application is a National Phase Patent Application of International Patent Application Number PCT/KR2018/007168, filed on Jun. 25, 2018, which claims priority of Korean Patent Application No. 10-2017-0167460, filed Dec. 7, 2017, the entire contents of which are incorporated herein by reference.

BACKGROUND OF THE INVENTION

(a) Field of the Invention

This disclosure relates to a color conversion panel and a method of color manufacturing the conversion panel.

(b) Description of the Related Art

Low refractive index materials may be used for various devices dealing with light. When using characteristics of a low refractive index, low reflectance effect may be exhibited. The low refractive index materials may be used for a layer that decreases light loss on a low reflection layer of a lens outside of a photosensor, on an anti-reflection coating (AR) of an outermost of a display or a solar cell, or inside the device where light moves, to increase efficiency. Herein, as the refractive index of the coating layer is lowered, a thickness of the coating layer may be decreased, and thus a margin of the coating film may become wider and efficiency according to device purposes may be increased.

Particularly, as a display has been recently developed, various display devices using displays are diversified. There are needs for luminous efficiency of photoluminescence materials in OLED or display devices including quantum dots of the display devices.

SUMMARY OF THE INVENTION

The present disclosure provides a color conversion panel having increased luminous efficiency.

In addition, the technical object to be solved by the present invention is not limited to those mentioned above, and another technical objects which are not mentioned will be clearly understood by a person having an ordinary skill in the art to which the present invention pertains from the following description.

A color conversion panel according to an embodiment includes a substrate, a low refractive layer disposed on one surface of the substrate and including a carbosilane-siloxane copolymer, a color conversion layer disposed on the low refractive layer and including a color conversion member, and a planarization layer covering the low refractive layer and the color conversion layer, wherein the low refractive layer has a refractive index of less than or equal to 1.30 in a wavelength of 500 nm to 550 nm and the color conversion member includes a quantum dot.

A method of manufacturing a color conversion panel according to another embodiment includes coating a composition for a low refractive layer on a substrate followed by curing or drying the coated composition for the low refractive layer to form a low refractive layer including a carbosilane-siloxane copolymer, forming a color conversion layer including a color conversion member including a quantum dot on the low refractive layer, and forming a planarization layer on the color conversion layer, wherein the low refractive layer has a refractive index of less than or equal to 1.30 in a wavelength of 500 nm to 550 nm.

According to the present disclosure, a color conversion panel capable of improving luminous efficiency and a method of manufacturing the color conversion panel may be provided.

DESCRIPTION OF SYMBOLS

100: color conversion panel
110: substrate
112: protective layer
120: low refractive layer
130: color conversion layer
132: first color conversion member
134: second color conversion member
136: transmitting member
140: planarization layer
150: first capping layer
160: second capping layer
A: first region
B: second region
C: third region

DETAILED DESCRIPTION OF THE EMBODIMENTS

Hereinafter, the exemplary embodiments of the present invention will be described in detail, referring to the accompanying drawings. However, in the description of the present disclosure, descriptions for already known functions or components will be omitted for clarifying the gist of the present disclosure.

In order to clearly describe the present disclosure, parts which are not related to the description are omitted, and the same reference numeral refers to the same or like components, throughout the specification. In addition, since the size and the thickness of each component shown in the drawing are optionally represented for convenience of the description, the present disclosure is not limited to the illustration.

In the drawings, the thickness of layers, films, panels, regions, etc., are exaggerated for clarity. In the drawings, the thickness of a part of layers or regions, etc., is exaggerated for clarity. It will be understood that when an element such as a layer, film, region, or substrate is referred to as being "on" another element, it can be directly on the other element or intervening elements may also be present.

Figure 1:
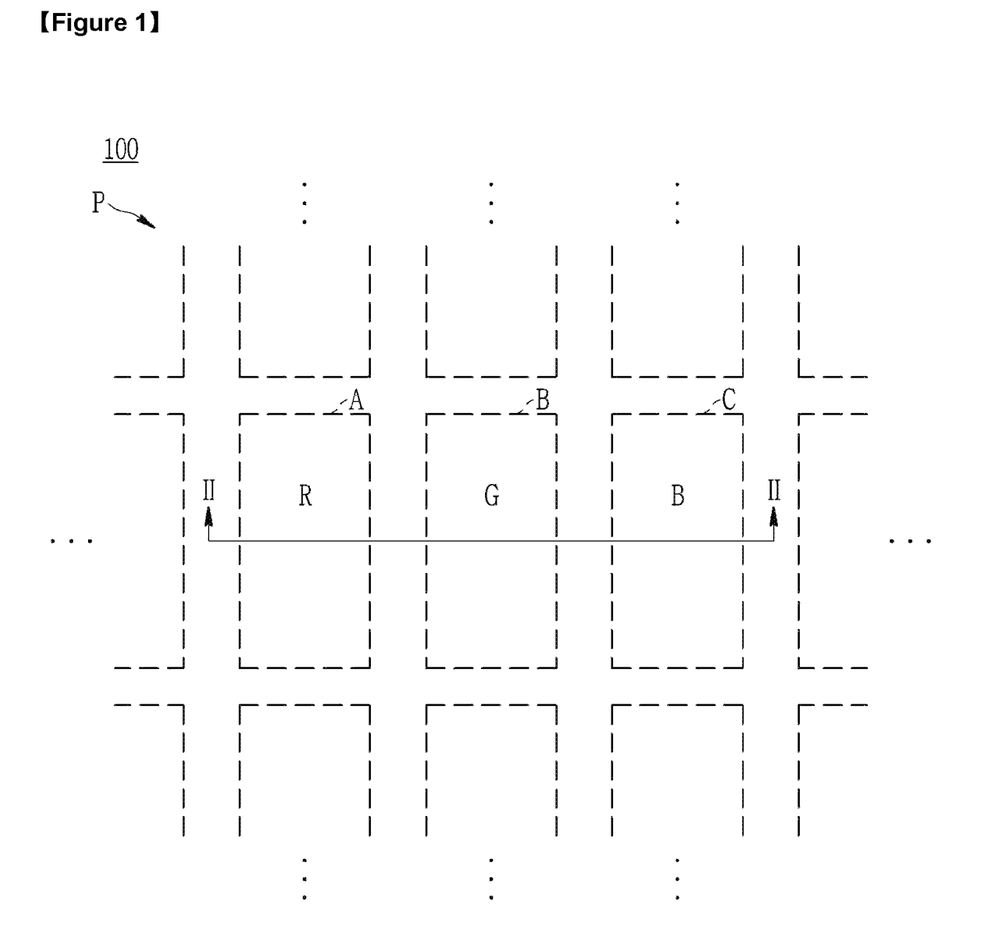
FIG. 1 is a schematic top plan view of a color conversion panel according to an embodiment.
Figure 2:
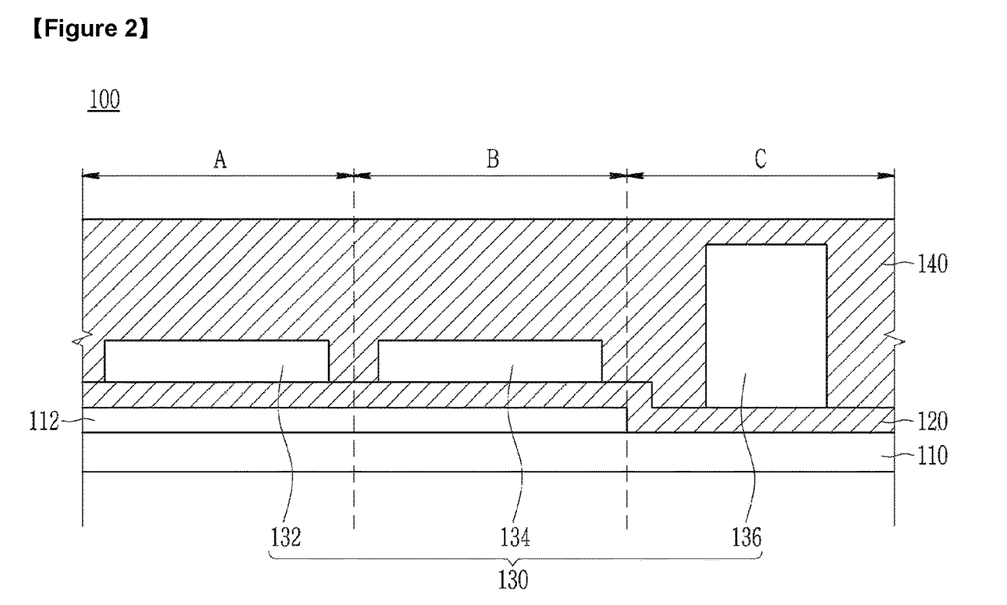
FIG. 2 is a schematic cross-sectional view showing a cross-section taken along the II-II line of FIG. 1.

FIG. 1 is a schematic top plan view of a color conversion panel 100 according to an embodiment and FIG. 2 is a schematic cross-sectional view showing a cross-section taken along the II-II line of FIG. 1.

Referring to FIG. 2, a color conversion panel 100 according to an example embodiment includes a substrate 110, a low refractive layer 120, a color conversion layer 130, and a planarization layer 140, wherein the color conversion layer 130 may include color conversion layers that emit light in at least two different wavelengths such as a first color conversion member 132 that emits light in a first wavelength and a second color conversion member 134 that emits light in a second wavelength.

The substrate 110 is made of a transparent and electrically insulating material and a protective layer 112 may be further included at positions corresponding to the first color conversion member 132 and the second color conversion member 134. The protective layer 112 is formed on one surface of the substrate 110 and makes patterning of the color conversion layer 130 be performed smoothly and protects the color conversion member inside the color conversion layer 130 when the color conversion layer 130 is formed on the substrate 110.

The low refractive layer 120 covers a part of the substrate 110 and the protective layer 112 on one surface of the substrate 110, for example, on one surface of the substrate 110 on which the protective layer 112 is formed. The low refractive layer 120 according to an embodiment has a relatively low refractive index of less than or equal to 1.30, for example, less than or equal to 1.25, less than or equal to 1.20, less than or equal to 1.19, less than or equal to 1.18, less than or equal to 1.17, less than or equal to 1.16, less than or equal to 1.15, less than or equal to 1.14, or less than or equal to 1.13 in a wavelength of 500 nm to 550 nm, and when the color conversion layer 130 is formed on the low refractive layer 120, light emitted from the color conversion layer 130 may be prevented from being reflected toward the substrate 110. Therefore, the color conversion panel 100 including the color conversion layer 130 formed on the low refractive layer 120 according to an embodiment may have further improved luminous efficiency. The refractive index in the present specification refers to an absolute refractive index indicating a ratio of speeds of light in vacuum and a medium.

As described above, the color conversion layer 130 is formed on the low refractive layer 120. The color conversion panel 100 according to an example embodiment in FIG. 1 includes a first region A that emits light in a first wavelength and a second region B that emits light in a second wavelength. For example, the first region A may emit red light (R) and the second region B may emit green light (G), but they are not limited thereto. In addition, the color conversion panel 100 may emit blue light (B) or may further include a third region C emitting white light.

The first region A and the second region B respectively include the first color conversion member 132 emitting light in a first wavelength and the second color conversion member 134 emitting light in a second wavelength, and each of the first color conversion member 132 and the second color conversion member 134 may respectively include quantum dots that convert a wavelength of incident light into light in other wavelengths. The color conversion members 132 and 134, and the quantum dots included in the color conversion layer 130 will be described later.

Meanwhile, referring to FIG. 1, the color conversion layer 130 may further include a transmitting member 136 disposed corresponding to the third region C. The transmitting member 136 may emit light received from a light source as itself without separate color conversion. For this, for example, the transmitting member 136 may be formed at the same height as the color conversion layer 130. However, the transmitting member 136 is not limited thereto, and may also include quantum dots in order to emit light converted into a certain wavelength like the first color conversion member 132 and the second color conversion member 134.

Hereinafter, the low refractive layer 120 according to an example embodiment is described in more detail.

The low refractive layer 120 including the carbosilane-siloxane copolymer may be formed by coating a composition for the low refractive layer including a carbosilane-siloxane copolymer on the substrate 110 followed by curing the same. The composition for the low refractive layer may include the following components: (a) a carbosilane-siloxane copolymer, (b) an organic polymer having a boiling point of 100° C. to 200° C., (c) a surfactant, and (d) a solvent. Hereinafter, the composition for the low refractive layer is described in detail.

(a) Carbosilane-Siloxane Copolymer

The carbosilane-siloxane copolymer may be prepared by a hydrolysis condensation reaction of a silane compound represented by Chemical Formula 1 and a carbosilane compound represented by Chemical Formula 2.

[Chemical Formula 1]

In Chemical Formula 1, $R^1$ is hydrogen, a C1 to C30 alkyl group, a C2 to C30 alkenyl group, a C6 to C30 aryl group, a C3 to C30 cycloalkyl group, a C1 to C30 alkoxy group, a carboxyl group, R(C=O)—, R(C=O)O— (wherein R is a C1 to C30 alkyl group, a C3 to C30 cycloalkyl group, or a C6 to C30 aryl group), an epoxy group-containing monovalent organic group, a (meth)acryl group, a (meth)acrylate group, a C1 to C30 alkyl group substituted with a (meth)acryl group, a C1 to C30 alkyl group substituted with a (meth)acrylate group, or a combination thereof, $R^2$ is one of hydrogen, a C1 to C30 alkyl group, a C3 to C30 cycloalkyl group, a C2 to C30 alkenyl group, and a C6 to C30 aryl group, and n is in the range of 0≤n<4.

[Chemical Formula 2]

In Chemical Formula 2, $R^3$ is hydrogen, a C1 to C30 alkyl group, a C3 to C30 cycloalkyl group, a C2 to C30 alkenyl group, or a C6 to C30 aryl group, and Y is a C1 to C30 alkylene group, a C2 to C30 alkenylene group, a C3 to C30 cycloalkylene group, a C6 to C30 arylene group, or a combination thereof.

In Chemical Formula 1, n may be in the range of 0≤n<3.

The carbosilane-siloxane copolymer prepared from the silane compound represented by Chemical Formula 1 and the carbosilane compound represented by Chemical Formula 2 may be represented by Chemical Formula 3:

[Chemical Formula 3]

In Chemical Formula 3, $R^4$ to $R^9$ are hydrogen, a C1 to C30 alkyl group, a C2 to C30 alkenyl group, a C6 to C30 aryl group, a C3 to C30 cycloalkyl group, a C1 to C30 alkoxy group, a carboxyl group, R(C=O)—, R(C=O)O— (wherein R is a C1 to C30 alkyl group, a C3 to C30 cycloalkyl group, or a C6 to C30 aryl group), an epoxy group-containing monovalent organic group, (meth)acryl group, (meth)acrylate group, a C1 to C30 alkyl group substituted with a (meth)acryl group, a C1 to C30 alkyl group substituted with a (meth)acrylate group, or a combination thereof, Y is a C1 to C30 alkylene group, a C2 to C30 alkenylene group, a C3 to C30 cycloalkylene group, a C6 to C30 aryl group, or a combination thereof, 0≤M≤0.5, 0≤D≤0.5, 0<T1≤0.95, 0<T2≤0.2, 0<Q≤0.9, and M+D+T1+T2+Q=1.

In an example embodiment, in Chemical Formula 3, M=0, 0<D≤0.2, 0.1≤T1≤0.95, 0<T2<0.2, 0.05≤Q≤0.9, and D+T1+T2+Q=1.

In another example embodiment, in Chemical Formula 3, M=0, D=0, 0.30≤T1≤0.95, 0<T2<0.2, 0.05≤Q≤0.8, and T1+T2+Q=1.

A polystyrene-reduced weight average molecular weight (Mw) of the carbosilane-siloxane copolymer may be 3,000 to 5,000,000, for example, 3,200 to 5,000,000, for example, 4,000 to 5,000,000, for example, 5,000 to 5,000,000, for example, 10,000 to 5,000,000, for example, 100,000 to 5,000,000, for example, 200,000 to 5,000,000, for example, 300,000 to 5,000,000, for example, 400,000 to 5,000,000, for example, 500,000 to 5,000,000, for example, 500,000 to 4,500,000, for example, 500,000 to 4,000,000, for example, 500,000 to 3,500,000, for example, 500,000 to 3,000,000, or for example, 500,000 to 2,500,000, but is not limited thereto.

The carbosilane-siloxane copolymer may be in an amount of 30 wt %, less than or equal to 1 wt % to 25 wt %, 1.5 wt % to 20 wt %, 2 wt % to 15 wt %, 2.5 wt % to 10 wt %, 3 wt % to 10 wt %, 3.5 wt % to 10 wt %, 4.5 wt % to 10 wt %, or 5 wt % to 10 wt % based on a total weight of the composition for the low refractive layer, but is not limited thereto.

(b) Organic Polymer Having Boiling Point of 100° C. to 200° C.

On the other hand, the composition for the low refractive layer 120 may include an organic polymer having a boiling point of 100° C. to 200° C. along with the carbosilane-siloxane copolymer.

The organic polymer having a boiling point of 100° C. to 200° C. may be a polyalkylene oxide-based copolymer, a polyarylene oxide copolymer, and a glycol-based copolymer. Examples of the glycol-based copolymer may be poly(ethylene) glycol, poly(propylene) glycol, and the like and examples of the polyalkylene or polyarylene oxide-based copolymer may be polyethylene oxide, polypropylene oxide, poly(phenylene) oxide, and the like.

A number average molecular weight (Mn) of the organic polymer may be 100 to 10,000, 100 to 8,000, 200 to 7,000, 300 to 6,000, 350 to 5,000, 400 to 4,500, 450 to 4,000, 500 to 4,000, 500 to 3,500, 600 to 3.000, 650 to 3,000, 700 to 3,000, 800 to 3,000, 900 to 3,000, 1,000 to 3,000, 1,000 to 2,500, or 1,000 to 2,000, but is not limited thereto.

In case that the organic polymer having a boiling point of 100° C. to 200° C. is included with the solvent and the carbosilane-siloxane copolymer in the composition for a low refractive layer, a temperature is increased up to 100° C. to 200° C. when the composition is coated on the substrate and then heated to cure the carbosilane-siloxane copolymer, the organic polymer having a boiling point of 100° C. to 200° C. may be evaporated from the composition for the low refractive layer coated on the substrate. As the organic polymer is evaporated, nanopores may be formed inside the coating layer formed by coating the composition for the low refractive layer, and a cured layer including the carbosilane-siloxane copolymer in which nano pores are formed may have a lower refractive index than a cured layer prepared from the carbosilane-siloxane copolymer. Accordingly, the low refractive layer having a lower refractive index including the carbosilane-siloxane copolymer is easily formed by including the organic polymer. Therefore, luminous efficiency of the color conversion panel 100 according to an embodiment may be further improved.

The organic polymer having a boiling point of 100° C. to 200° C. may be in an amount of 50 to 150 parts by weight based on 100 parts by weight of the carbosilane-siloxane copolymer.

In addition, the organic polymer may be premixed with the surfactant and may be included in a solid amount of 30 wt %, less than or equal to 1 wt % to 25 wt %, 1.5 wt % to 20 wt %, 2 wt % to 15 wt %, 2.5 wt % to 10 wt %, 3 wt % to 10 wt %, 3.5 wt % to 10 wt %, 4.5 wt % to 10 wt %, or 5 wt % to 10 wt % based on a total weight of the composition for the low refractive layer, but is not limited thereto.

(c) Pore-Forming Surfactant

The composition for a low refractive layer according to an embodiment may further include a surfactant for formation of additional pores.

The surfactant may help the carbosilane-siloxane copolymer having a property of an inorganic material and the organic polymer having a boiling point of 100° C. to 200° C. having a property of an organic material mix smoothly in the solvent, and may form additional nanopores. The surfactant may be premixed with the organic polymer having a boiling point of 100° C. to 200° C. in a weight ratio of 1:9 to 9:1, 2:8 to 8:2, 3:7 to 7:3, 4:6 to 6:4, or 5:5, and then may be mixed with the carbosilane-siloxane copolymer.

The surfactant may include an ammonium salt represented by Chemical Formula 4:

[Chemical Formula 4]

In Chemical Formula 4, $R^a$ to $R^d$ are independently a C1 to C30 alkyl group, and X is a halogen atom, for example, F, Cl, Br, or I.

In an example embodiment, three of $R^a$ to $R^d$ of Chemical Formula 4 may be methyl groups, and the rest one may be a C10 to C30 alkyl group.

Specific examples of the surfactant represented by Chemical Formula 4 may be cetyltrimethylammonium chloride (hexadecyltrimethylammonium chloride), dodecyltrimethylammonium chloride, and the like, but are not limited thereto.

(d) Solvent

The solvent for forming the low refractive layer may be any solvent that may be used at a process temperature of greater than or equal to 200° C. For example, the solvent may be an alcohol-type solvent, for example, butanol or isopropanol, a ketone-type solvent, for example, PMEA or DIBK, and may be one or more of any solvent that may be used at the process temperature as known solvent in this art beside these solvents.

The solvent may be included in an amount of 300 to 2,000 parts by weight based on 100 parts by weight of the carbosilane-siloxane copolymer and its amount may be controlled according to a total solid content.

(e) Curing Catalyst

The composition for the low refractive layer may further include a thermally curing catalyst in order to promote curing of untreated silanol group of the siloxane resin terminal end of the carbosilane-siloxane copolymer, but may not include such a catalyst according to the used carbosilane-siloxane resin. Examples of the curing catalyst may include an ammonium salt such as tetrabutylammonium acetate (TBAA).

When the curing catalyst is used, such a catalyst may be included in an amount of less than or equal to 5 parts by weight, for example less than or equal to 3 parts by weight, or less than or equal to 1 part by weight based on 100 parts by weight of the carbosilane-siloxane copolymer.

(f) Other Additive

The composition for the low refractive layer may further include various additives known in this art. These additives may be a surfactant, for example, a fluorine-based surfactant in order to improve coating properties and prevent defects when coating the composition for the low refractive layer, but are not limited thereto. These additives may be included in an amount of less than or equal to 10 parts by weight, less than or equal to 8 parts by weight, less than or equal to 5 parts by weight, less than or equal to 3 parts by weight, less than or equal to 2 parts by weight, or less than or equal to 1 part by weight based on 100 parts by weight of the carbosilane-siloxane copolymer.

As described above, the composition for a low refractive layer is coated on the substrate, dried, and then cured to form a low refractive layer including the carbosilane-siloxane copolymer.

The composition for the low refractive layer may be coated on the substrate using any method of known various methods in this art, and may be for example, a spin coating, a slit and spin coating, a slit coating, a roll coating method, or a die coating, but is not limited thereto. In an example embodiment, the composition for the low refractive layer may be spin-coated on the substrate.

The composition for a low refractive layer coated on the substrate may be dried or cured by the drying and curing processes to form a low refractive layer. The drying or curing temperature may be a temperature of greater than or equal to 150° C. and less than or equal to 300° C., greater than or equal to 150° C. and less than or equal to 280° C., greater than or equal to 150° C. and less than or equal to 270° C., greater than or equal to 150° C. and less than or equal to 250° C., greater than or equal to 170° C. and less than or equal to 250° C., or greater than or equal to 180° C. and less than or equal to 240° C.

The low refractive layer 120 manufactured according to the method may have a thickness of 100 nm to 2.0 μm.

Meanwhile, the low refractive layer 120 may have a light transmittance of greater than or equal to 60%, for example greater than or equal to 70%, greater than or equal to 80%, greater than or equal to 90%, greater than or equal to 95% in a remaining visible light wavelength region including a wavelength of 400 nm except a certain wavelength region.

In addition, an average reflectance (SCE value) in a visible ray range of an entire wavelength region of 400 nm to 750 nm may be less than or equal to 10%, less than or equal to 7%, less than or equal to 5%, or less than or equal to 3%. Accordingly, the color conversion panel 100 according to an embodiment may have high light transmittance even at a low wavelength range, and may maintain a low reflectance through an entire region of a visible ray wavelength to further improve optical properties.

As described above, after forming the low refractive layer 120, the color conversion layer 130 is formed thereon, and the color conversion layer 130 includes the color conversion members 132 and 134 including quantum dots that absorb light in each certain wavelength and emit light in other wavelengths. The color conversion members 132 and 134 may be formed by coating the composition for the color conversion layer including quantum dots on the low refractive layer 120. The composition for the color conversion layer may include a quantum dot, a solvent for dispersing a quantum dot, a binder resin, a photopolymerizable monomer, a photopolymerization initiator, and other additives. Hereinafter, each component of the composition for the color conversion layer is described in detail.

(1) Quantum Dot

The quantum dot has isotropic optical radiation characteristics. The quantum dot may emit radiation light in a radiation direction while quantum dot is returning to the ground state after having been excited by receiving incident light come from the light source. Thereby, the color conversion layer 130 including the quantum dot as the color conversion members 132 and 134 may be used as an emission layer.

Because the quantum dot has a discontinuous energy bandgap due to a quantum confinement effect, the quantum dot absorbs incident light and emits radiation light having a certain wavelength region. That is, the color conversion layer 130 according to an embodiment includes the quantum dot and thus may display images having a high color purity compared with other light emitting elements.

As shown in FIG. 1, since the color conversion layer 130 includes the first color conversion member 132 that emits light in the first wavelength and the second color conversion member 134 that emits light in the second wavelength, each of the first color conversion member 132 and the second color conversion member 134 may include quantum dots absorbing and/or emitting light in different wavelengths. Herein the first color conversion member 132 may emit reddish light by including a first quantum dot having a maximum fluorescence light emitting wavelength in 580 nm to 700 nm and the second color conversion member 134 may emit greenish light by including a second quantum dot having a maximum fluorescence light emitting wavelength in 450 nm to 580 nm. However, the first color conversion member 132 and the second color conversion member 134 may include the same quantum dots that absorb light in the same wavelength and emit light in the same wavelength. The quantum dots included in the first color conversion member 132 and the second color conversion member 134 may have each average particle diameter of 5 nm to 20 nm.

The quantum dots may have a full width at half maximum (FWHM) of 20 nm to 100 nm, for example 20 nm to 80 nm, for example 40 nm to 60 nm. When the quantum dots have a full width at half maximum (FWHM) within the ranges, a color purity increases and thus color reproducibility may be improved when being used as a color filter material.

The quantum dots may be an organic material, an inorganic material, or a hybrid material of an organic material and an inorganic material, and may include a Group II-VI compound, a Group III-V compound, a Group IV-VI compound, a Group IV compound, a Group II-III-VI compound, a Group I-II-IV-VI compound, or a combination thereof.

The quantum dot is not shown in the drawing, but may include a core and a shell surrounding the core and the core and shell are independently a core consisting of Group II-IV, Group III-V, and the like, and may have a structure of a core/shell, a core/first shell/second shell, an alloy, an alloy/shell, and the like.

The structure of the quantum dot is not limited particularly, but in the case of the quantum dot having a core/shell structure, an entire size (average particle diameter) of the quantum dot including the shell may be 1 nm to 15 nm, for example 5 nm to 10 nm.

Meanwhile, the shapes of the quantum dot may be generally-used shapes in the art and is not limited particularly. For example, the quantum dot may have a pyramid, multi-arm, or cubic nanoparticle, nanotube, nanowire, nanofiber, or nanosheet shape as well as a spherical shape.

In order to improve stability and dispersibility of the quantum dot, the shell surface may be substituted with an organic material to stabilize a quantum dot and the organic material may include a thiol-based compound, an amine-based compound, a phosphine oxide-based compound, an acrylic compound, a Si-based compound, and the like, but is not limited thereto.

Since an interest in environmental protection has much increased recently over the whole world, and regulations of toxic materials also has been fortified, an environmentally-friendly non-cadmium-based light emitting material is highly sought after. For example, InP/ZnS core-shell type quantum dots, InP/ZnSe/ZnS core-first shell-second shell type quantum dots while having sufficient quantum efficiency (quantum yield) compared to a light emitting material having a cadmium-based core, quantum dots are much more environmentally-friendly, but not necessarily limited thereto.

(2) Solvent for Dispersing Quantum Dot

The solvent for dispersing the quantum dot may be an amphiphilic solvent having a polar group and a non-polar group so as to dissolve organic components of the binder resin, the photopolymerizable monomer, the photopolymerization initiator, and the other additives simultaneously as well as the quantum dot that is an inorganic particle. For example, the solvent may be an amphiphilic compound having a boiling point of 148° C. to 250° C., for example, 148° C. to 180° C. such as pentyl acetate, hexyl acetate, decyl acetate, dodecyl acetate, or cyclohexyl acetate. In an example embodiment, the solvent for dispersing the quantum dots may be cyclohexyl acetate, but is not limited thereto.

A compound having a relatively low boiling point such as isoamyl acetate, diethyl ether, dibutyl ether, or methyl isobutyl ketone may be mixed with the amphiphilic compound solvent having a relatively high boiling point.

The amphiphilic compound and the compound having a lower boiling point than the amphiphilic compound may be included in a weight ratio of 6:4 to 9:1. When the amphiphilic compound and the compound having a lower boiling point than the amphiphilic compound are included in the weight ratio or the compound having a lower boiling point than the amphiphilic compound is included in a larger amount than the amphiphilic compound, the quantum dots may be precipitated and photoconversion efficiency may be deteriorated. In addition, the amphiphilic compound is included in an excessively larger amount, for example nine times than the compound having a lower boiling point than the amphiphilic compound, hardness of a coating layer may be deteriorated due to excessive remaining solvents after coating and pre-baking processes.

(3) Binder Resin

In order to coat components in the composition for the color conversion layer including the quantum dots that are inorganic particles on the low refractive layer 120, the composition for the color conversion layer may include a binder resin. The binder resin may include an acryl-based binder resin, a cardo-based binder resin, or a combination thereof, and may include various known binders known in the art besides the above binder resins.

(4) Photopolymerizable Monomer

The photopolymerizable monomer may be a mono-functional or multi-functional ester of (meth)acrylic acid including at least one ethylenic unsaturated double bond. The photopolymerizable monomer may cause sufficient polymerization during exposure in a pattern-forming process of the composition for a color conversion layer including the photopolymerizable monomer by having the ethylenic unsaturated double bond, and a pattern having improved heat resistance, light resistance, and chemical resistance may be provided by curing the composition for a color conversion layer.

The photopolymerizable monomer may be treated with acid anhydride to improve developability.

(5) Photopolymerization Initiator

The photopolymerization initiator may be a generally-used initiator in the photosensitive resin composition, and may be for example an acetophenone-based compound, a benzophenone-based compound, a thioxanthone-based compound, a benzoin-based compound, a triazine-based compound, an oxime-based compound, an aminoketone-based compound, and the like. The photopolymerization initiator may be used with a photosensitizer capable of causing a chemical reaction by absorbing light and becoming excited and then, transferring its energy.

The photopolymerization initiator may use a carbazole-based compound, a diketone-based compound, a sulfonium borate-based compound, a diazo-based compound, an imidazole-based compound, a biimidazole-based compound, and the like besides the compounds.

In an example embodiment, the color conversion layer 130 is formed by coating the composition for the color conversion layer including the color conversion members 132 and 134 including the quantum dots on the low refractive layer 120 on the substrate 110 and then patterning the same. The patterning process may include, for example coating the composition for the color conversion layer on the substrate 110 on which the low refractive layer 120 is formed using a method of a spin or slit coating, a roll coating method, a screen-printing method, an applicator method, and the like, drying the same to form a film, exposing the film to form a pattern having shapes corresponding to the first color conversion member 132 and the second color conversion member 134 using a mask, developing the same to remove unnecessary parts, and heat resistance, and a post process to reheat the same in order to obtain a pattern having improved light resistance, close contacting property, crack resistance, chemical resistance, high strength, storage stability, and the like, or to irradiate an actinic ray, but is not limited thereto.

The first and second color conversion members 132 and 134 may further include a light scatterer (not shown) in addition to the quantum dots. The light scatterer may be dispersed in the color conversion layer 130 along with the quantum dots. The light scatterer may induce incident light to reach the quantum dots or a radiation direction so that a radiated light emitted from the quantum dots may be emitted outside from the color conversion layer 130. Thereby, deterioration of the photo-efficiency of the color conversion layer 130 may be minimized. On the other hand, the transmitting member 136 may also include a light scatterer.

The planarization layer 140 is formed on the low refractive layer 120 and the color conversion layer 130. The planarization layer 140 covers the low refractive layer 120 and the color conversion layer 130 to protect them and planarizes the surface of the color conversion panel 100. The planarization layer 140 may be made of a transparent and electrically insulating material so that light may be transmitted. Herein, the planarization layer 140 according to the present embodiment may consist of the same material as the low refractive layer 120.

For example, the planarization layer 140 is made of a low refractive index material including the carbosilane-siloxane copolymer like the low refractive layer 120 and thereby luminous efficiency of the color conversion panel 100 may be further improved. In addition, when incident light of the low refractive layer 120 enters the planarization layer 140, reflection or scattering may be minimized, and thereby optical loss at the interface may be minimized to provide the color conversion panel 100 having improved photo-efficiency.

Figure 3:
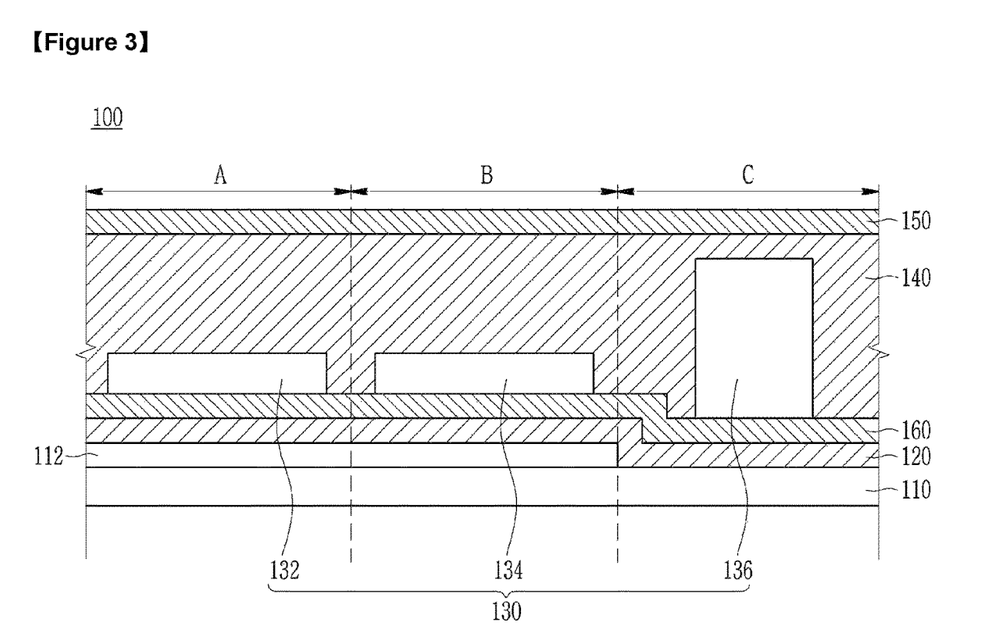
FIG. 3 is a cross-sectional view of an exemplary variation of FIG. 2.

FIG. 3 is a cross-sectional view of an exemplary variation of FIG. 2. Referring to FIG. 3, the color conversion panel 100 according to an exemplary variation may further include a first capping layer 150 and a second capping layer 160. In FIG. 3, exemplary variation including the first capping layer 150 and the second capping layer 160 is shown but one of them may be omitted.

The first capping layer 150 may be formed on the planarization layer 140 to cover the planarization layer 140. Therefore, it may be formed after forming the planarization layer 140. The first capping layer 150 may be formed on the entire surface of the substrate 110.

The second capping layer 160 may be formed between the low refractive layer 120 and the color conversion layer 130 and may be formed on the entire surface of the substrate 110, like the first capping layer 150. Therefore, the second capping layer 160 may be formed between a forming process of the low refractive layer 120 and a forming process of the color conversion layer 130.

The first capping layer 150 and the second capping layer 160 may also be made of a material having a low refractive index, for example $SiN_x$ like the low refractive layer 120. The first capping layer 150 forming an interface with the planarization layer 140 and the second capping layer 160 disposed between the low refractive layer 120 and the planarization layer 140 and forming interfaces with them may also be made of a material having a low refractive index, and thereby reflection or scattering of incident light to the first capping layer 150 and the second capping layer 160 may be minimized and thus optical loss at the interfaces may be minimized to provide the color conversion panel 100 having improved photo-efficiency.

Optical loss at the interfaces may be minimized by minimizing the reflection or scattering and thus the color conversion panel 100 having improved photo-efficiency may be provided.

The color conversion panel 100 including the first capping layer 150 and the second capping layer 160 may exhibit increase effects of luminous efficiency of 150% or greater compared with a color conversion panel not including the low refractive layer 120, the first capping layer 150, and the second capping layer 160.

The color conversion panel 100 according to an embodiment of the present invention and a method of manufacturing the same are explained. Accordingly, the color conversion panel 100 may have improved luminous efficiency due to quantum dots.

Hereinafter, the present invention is illustrated in more detail with reference to examples. These examples, however, are not in any sense to be interpreted as limiting the scope of the invention.

Preparation of Carbosilane-Siloxane Copolymer

Synthesis Example 1

570 g of isopropyl alcohol (IPA) was put in 1 liter of a 4-neck jacket reactor, and a mixture of methyl trimethoxy silane, tetraethyl orthosilicate, 1,2-(bis(trimethoxysilyl)ethane) in a molar ratio of 0.55:0.40:0.05 was put therein keeping a temperature of 25° C. Then, 1 g of tetramethyl ammonium hydroxide (TMAH) aqueous solution having a concentration of 20% and 27 g of distilled water 27 g were mixed and the mixture was dropped into the jacket reactor as one-drop and then stirred.

Then, the reactor was heated to 60° C. and a silicone polymer was grown to obtain a carbosilane-siloxane copolymer. A molecular weight (polystyrene-reduced) of the obtained carbosilane-siloxane copolymer was measured with GPC and the weight average molecular weight was 50,000.

Synthesis Example 2

1 kg of a mixed solvent of water and propylene glycol monomethyl ether acetate (PEGMEA) in a weight ratio of 1:80 was put into a 3-neck flask and 1 g of a 60% $HNO_3$ aqueous solution was added while keeping a temperature at 25° C. Subsequently, as monomers, a mixture of methyl trimethoxy silane, tetraethyl orthosilicate, 1,2-(bis(trimethoxysilyl)ethane in a molar ratio of 0.55:0.40:0.05 was put therein.

After putting the solvent, monomers, and catalyst, a temperature was increased to 60° C. and the resultant was heated and refluxed for 72 hours to perform a condensation polymerization reaction. A molecular weight (polystyrene-reduced) of the obtained carbosilane-siloxane copolymer was measured with GPC and the weight average molecular weight was 4,000.

Synthesis Example 3

1 kg of a mixed solvent of water and propylene glycol monomethyl ether acetate (PEGMEA) in a weight ratio of 1:80 was put into a 3-neck flask and 1 g of a 60% $HNO_3$ aqueous solution was added while keeping a temperature at 25° C. Subsequently, as monomers, a mixture of methyl trimethoxy silane, tetraethyl orthosilicate, 1,2-(bis(trimethoxysilyl)ethane in a molar ratio of 0.75:0.20:0.05 was put therein. After putting the solvent, monomers, and catalyst, a temperature was increased to 60° C. and the resultant was heated and refluxed for 72 hours to perform a condensation polymerization reaction. A molecular weight (polystyrene-reduced) of the obtained carbosilane-siloxane copolymer was measured with GPC and the weight average molecular weight was 3,200.

Comparative Synthesis Example 1 kg of a mixed solvent of water and propylene glycol monomethyl ether acetate (PEGMEA) in a weight ratio of 1:80 was put into a 3-neck flask and 1 g of a 60% $HNO_3$ aqueous solution was added while keeping a temperature at 25° C. Subsequently, as monomers, a mixture of methyl trimethoxy silane and tetraethyl orthosilicate in a molar ratio of 0.75:0.30 was put therein. After putting the solvent, monomers, and catalyst, a temperature was increased to 60° C. and the resultant was heated and refluxed for 72 hours to perform a condensation polymerization reaction. A molecular weight (polystyrene-reduced) of the obtained siloxane copolymer was measured with GPC and the weight average molecular weight was 3,800.

Example 1

3.0 wt % (solid content) of the carbosilane-siloxane copolymer of Synthesis Example 1, 3.0 wt % (solid content) of an organic polymer of propylene oxide polymer (PPO, Mn=2,000) and cetyltrimethyl ammonium chloride in a weight ratio of 5:5, and 0.01% (solid content) of surfactant (F-552) were mixed and dissolved in diisobutylketone (DIBK) for 30 minutes so that a solid concentration may be 6.0 wt %, and then was filtered using a 0.1 μm millipore filter to prepare a composition for a low refractive layer.

Example 2

7.5 wt % (solid content) of the carbosilane-siloxane copolymer of Synthesis Example 2, 7.5 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Example 3

7.5 wt % (solid content) of the carbosilane-siloxane copolymer of Synthesis Example 3, 7.5 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Example 4

10.0 wt % (solid content) of the carbosilane-siloxane copolymer of Synthesis Example 2, 5.0 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Example 5

6.0 wt % (solid content) of the carbosilane-siloxane copolymer of Synthesis Example 2, 9.0 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Comparative Example 1

7.5 wt % (solid content) of the siloxane copolymer of Comparative Synthesis Example, 7.5 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Comparative Example 2

10.0 wt % (solid content) of the siloxane copolymer of Comparative Synthesis Example, 5.0 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Comparative Example 3

6.0 wt % (solid content) of the siloxane copolymer of Comparative Synthesis Example, 9.0 wt % (solid content) of an organic polymer of PPO (Mn=2,000) and cetyltrimethylammonium chloride in a weight ratio of 5:5, and 0.01% (solid content) of surfactant (F-552) were mixed, and dissolved in DIBK for 30 minutes so that a solid concentration may be 15.0 wt % and then was filtered using a 0.1 μm millipore filter to prepare a composition for a low refractive layer.

Manufacture of Cured Film and Evaluation

The compositions for a low refractive layer prepared in Examples 1 to 5 and Comparative Examples 1 to 3 were respectively coated on a substrate for evaluating quantum dot efficiency using a spin coater (Opticoat MS-A150, Mikasa Co., Ltd.) at a speed of 300 rpm to 1500 rpm, pre-baked on a hot-plate at 100° C. for 120 seconds to form each film, and then cured and dried at a temperature of 180° C. to 200° C. for 5 minutes to obtain each coating cured film having a thickness of 1.0 μm, and each thickness of the coating cured films was measured using Alpha-step (Surface profiler KLA, Tencor Corp.).

(1) Appropriate Crack Margin of Coating Cured Film

During the process of manufacturing the coating cured film, each thickness of coating cured film was measured using Alpha-step, Surface profiler (KLA Tencor Corp.) at rpm at which cracks did not occur, and the results are shown in Table 1.

Appropriate crack margins of the coating cured films were greater than or equal to 2.0 μm, and when the margins were less than or equal to 2.0 μm, process margins became narrower, and thus they are difficult to use. The thicknesses of the coating cured films are most appropriately 1.0 μm, and when they are less than 1.0 μm, a mass-production is difficult and when they were stacked at a height of greater than or equal to 3.0 μm, cracks may occur and thus structure designs may be difficult.

(2) Refractive Index

A refractive index of each coating cured film obtained from the compositions of Examples 1 to 5 and Comparative Examples 1 to 3 was measured using spectroscopic ellipsometer (M-2000D, J.A. Woollam) and the results are shown in Table 1.

(3) Luminous Efficiency

Quantum dot efficiency of each coating cured film manufactured from the composition of Examples 1 to 5 and Comparative Examples 1 to 3 was measured using Quantaurus-QY Quantum Yield Spectrometer (Hamamatsu), and the results are shown in Table 1.

(4) Luminous Efficiency_Capping

SiNx was deposited in a thickness of 500 Å using a chemical vapor deposition (CVD) method on each coating cured film manufactured from the composition of Examples 1 to 5 and Comparative Examples 1 to 3, and quantum dot efficiency was measured using Quantaurus-QY Quantum Yield Spectrometer (Hamamatsu), and the results are shown in Table 1.

TABLE 1

|  | Refractive index | Crack margin (μm) | Luminous efficiency (%) | Luminous efficiency (%) (capping) |
|---|---|---|---|---|
| Example 1 | 1.21 | 2.7 | 131 | 151 |
| Example 2 | 1.23 | 2.3 | 129 | 150 |
| Example 3 | 1.25 | 2.5 | 125 | 148 |
| Example 4 | 1.29 | 2.8 | 116 | 130 |
| Example 5 | 1.16 | 2.2 | 135 | 151 |
| Comparative Example 1 | 1.38 | 1.7 | 98 | 95 |
| Comparative Example 2 | 1.41 | 1.1 | 96 | 95 |
| Comparative Example 3 | 1.44 | 1.4 | 92 | 90 |
| Comparative Example 4 | 1.15 | 1.6 | 102 | 100 |

Referring to Table 1, the coating cured films according to Examples 1 to 5 showed refractive indexes of less than or equal to 1.30 compared with Comparative Examples 1 to 4, and crack margin of greater than or equal to 2.0 μm which the films were thick at rpm at which cracks did not occur. Luminous efficiency of the coating cured films according to Examples 1 to 5 showed remarkably improved compared with luminous efficiency of those according to Comparative Examples 1 to 4.

Resultantly, the coating cured films according to Examples 1 to 5 showed decrease of refractive indexes, inhibition of crack occurrence, and increase of luminous efficiency compared with the coating cured films according to Comparative Examples 1 to 4.

Hereinbefore, the certain exemplary embodiments of the present invention have been described and illustrated, however, it is apparent to a person with ordinary skill in the art that the present invention is not limited to the exemplary embodiment as described, and may be variously modified and transformed without departing from the spirit and scope of the present invention. Accordingly, the modified or transformed exemplary embodiments as such may not be understood separately from the technical ideas and aspects of the present invention, and the modified exemplary embodiments are within the scope of the claims of the present invention.

The invention claimed is:

1. A color conversion panel, comprising
a substrate;
a low refractive layer disposed on one surface of the substrate and comprising a carbosilane-siloxane copolymer;
a color conversion layer disposed on the low refractive layer and comprising a color conversion member; and
a planarization layer covering the low refractive layer and the color conversion layer,
wherein the low refractive layer has a refractive index of less than or equal to 1.30 in a wavelength of 500 nm to 550 nm,
the color conversion member comprises a quantum dot,
wherein the low refractive layer has a light transmittance of greater than or equal to 90% at 400 nm, and
wherein the color conversion panel further comprises at least one selected from:
a first capping layer covering the planarization layer; and
a second capping layer disposed between the low refractive layer and the color conversion layer.

2. The color conversion panel of claim 1, wherein the planarization layer comprises the same material as the low refractive layer.

3. The color conversion panel of claim 1, wherein the low refractive layer is formed by coating a composition for the low refractive layer comprising following components selected from (a) to (d) on the substrate:
(a) a carbosilane-siloxane copolymer represented by Chemical Formula 3: which is cured to form the carbosilane-siloxane copolymer comprised in the low refractive layer

[Chemical Formula 3]

wherein, in Chemical Formula 3,
$R^4$ to $R^9$ are hydrogen; C1 to C30 alkyl group; C2 to C30 alkenyl group; C6 to C30 aryl group; C3 to C30 cycloalkyl group; C1 to C30 alkoxy group; a carboxyl group; $R(C=O)-$, $R(C=O)O-$, wherein R is a C1 to C30 alkyl group, C3 to C30 cycloalkyl group, or C6 to C30 aryl group; an epoxy group-containing monovalent organic group; (meth)acryl group; (meth)acrylate group; a C1 to C30 alkyl group substituted with a (meth)acryl group; a C1 to C30 alkyl group substituted with a (meth)acrylate group; or a combination thereof,
Y is a C1 to C30 alkylene group, a C2 to C30 alkenylene group, a C3 to C30 cycloalkylene group, a C6 to C30 arylene group, or a combination thereof,
$0 \leq M \leq 0.5$, $0 \leq D \leq 0.5$, $0 < T1 \leq 0.95$, $0 < T2 \leq 0.2$, $0 < Q \leq 0.9$, and
$M+D+T1+T2+Q=1$,
(b) an organic polymer having a boiling point of 100° C. to 200° C.,
(c) a surfactant represented by Chemical Formula 4:

[Chemical Formula 4]

wherein, in Chemical Formula 4, $R^a$ to $R^d$ are independently a C1 to C30 alkyl group,
X is a halogen atom selected from F, Cl, Br, or I, and
(d) a solvent.

4. The color conversion panel of claim 3, wherein in Chemical Formula 3, M=0, $0<D\leq0.2$, $0.1\leq T1\leq0.95$, $0<T2<0.2$, $0.05\leq Q\leq0.9$, and $D+T1+T2+Q=1$.

5. The color conversion panel of claim 3, wherein the carbosilane-siloxane copolymer represented by Chemical Formula 3 is formed by a hydrolysis condensation reaction of a compound represented by Chemical Formula 1 and a compound represented by Chemical Formula 2:

[Chemical Formula 1]

wherein, in Chemical Formula 1, $R^1$ is hydrogen; a C1 to C30 alkyl group; a C2 to C30 alkenyl group; a C6 to C30 aryl group; a C3 to C30 cycloalkyl group; a C1 to C30 alkoxy group; a carboxyl group; R(C=O)—, R(C=O)O—, wherein R is a C1 to C30 alkyl group, a C3 to C30 cycloalkyl group, or a C6 to C30 aryl group; an epoxy group-containing monovalent organic group; a (meth)acryl group; a (meth)acrylate group; a C1 to C30 alkyl group substituted with a (meth)acryl group; a C1 to C30 alkyl group substituted with a (meth)acrylate group; or a combination thereof, $R^2$ is one of hydrogen, a C1 to C30 alkyl group, a C3 to C30 cycloalkyl group, a C2 to C30 alkenyl group, or a C6 to C30 aryl group, and n is in the range of 0≤n<4,

[Chemical Formula 2]

wherein, in Chemical Formula 2, $R^3$ is hydrogen, a C1 to C30 alkyl group, a C3 to C30 cycloalkyl group, a C2 to C30 alkenyl group, or a C6 to C30 aryl group and Y is a C1 to C30 alkylene group, a C2 to C30 alkenylene group, a C3 to C30 cycloalkylene group, a C6 to C30 arylene group, or a combination thereof.

6. The color conversion panel of claim 3, wherein a polystyrene-reduced weight average molecular weight (Mw) of the carbosilane-siloxane copolymer represented by Chemical Formula 3 ranges from 3,000 to 5,000,000.

7. The color conversion panel of claim 3, wherein the organic polymer is at least one selected from a polyalkylene oxide-based copolymer, a polyarylene oxide copolymer, and a glycol-based copolymer.

8. The color conversion panel of claim 3, wherein a number average molecular weight of the organic polymer ranges from 100 to 10,000.

9. A color conversion panel, comprising
a substrate;
a low refractive layer disposed on one surface of the substrate and comprising a carbosilane-siloxane copolymer;
a color conversion layer disposed on the low refractive layer and comprising a color conversion member; and
a planarization layer covering the low refractive layer and the color conversion layer,
wherein the low refractive layer has a refractive index of less than or equal to 1.30 in a wavelength of 500 nm to 550 nm, and
the color conversion member comprises a quantum dot,
wherein the low refractive layer is formed by coating a composition for the low refractive layer comprising following components selected from (a) to (d) on the substrate:

(a) a carbosilane-siloxane copolymer represented by Chemical Formula 3: which is cured to form the carbosilane-siloxane copolymer comprised in the low refractive layer

[Chemical Formula 3]

wherein, in Chemical Formula 3,
$R^4$ to $R^9$ are hydrogen; C1 to C30 alkyl group; C2 to C30 alkenyl group; C6 to C30 aryl group; C3 to C30 cycloalkyl group; C1 to C30 alkoxy group; a carboxyl group; R(C=O)—, R(C=O)O—, wherein R is a C1 to C30 alkyl group, C3 to C30 cycloalkyl group, or C6 to C30 aryl group; an epoxy group-containing monovalent organic group; (meth)acryl group; (meth)acrylate group; a C1 to C30 alkyl group substituted with a (meth)acryl group; a C1 to C30 alkyl group substituted with a (meth)acrylate group; or a combination thereof, Y is a C1 to C30 alkylene group, a C2 to C30 alkenylene group, a C3 to C30 cycloalkylene group, a C6 to C30 arylene group, or a combination thereof,

0≤M≤0.5, 0≤D≤0.5, 0<T1≤0.95, 0<T2≤0.2, 0<Q≤0.9, and

M+D+T1+T2+Q=1, (b) an organic polymer having a boiling point of 100° C. to 200° C., (c) a surfactant represented by Chemical Formula 4:

[Chemical Formula 4]

wherein, in Chemical Formula 4, $R^a$ to $R^d$ are independently a C1 to C30 alkyl group, X is a halogen atom selected from F, Cl, Br, or I, and (d) a solvent, and wherein the carbosilane-siloxane copolymer is present in an amount of less than or equal to 30 wt % based on a total weight of the composition.

10. The color conversion panel of claim 9, wherein the organic polymer is at least one selected from a polyalkylene oxide-based copolymer, a polyarylene oxide copolymer, and a glycol-based copolymer.

11. The color conversion panel of claim 9, wherein a number average molecular weight of the organic polymer ranges from 100 to 10,000.

12. The color conversion panel of claim 9, wherein the low refractive layer has a light transmittance of greater than or equal to 90% at 400 nm.

13. The color conversion panel of claim 9, wherein the color conversion panel further comprises at least one selected from:
a first capping layer covering the planarization layer; and
a second capping layer disposed between the low refractive layer and the color conversion layer.

14. A color conversion panel, comprising
a substrate;
a low refractive layer disposed on one surface of the substrate and comprising a carbosilane-siloxane copolymer;
a color conversion layer disposed on the low refractive layer and comprising a color conversion member; and
a planarization layer covering the low refractive layer and the color conversion layer,
wherein the low refractive layer has a refractive index of less than or equal to 1.30 in a wavelength of 500 nm to 550 nm, and
the color conversion member comprises a quantum dot,
wherein the low refractive layer is formed by coating a composition for the low refractive layer comprising following components selected from (a) to (d) on the substrate:

(a) a carbosilane-siloxane copolymer represented by Chemical Formula 3: which is cured to form the carbosilane-siloxane copolymer comprised in the low refractive layer

[Chemical Formula 3]

wherein, in Chemical Formula 3, $R^4$ to $R^9$ are hydrogen; C1 to C30 alkyl group; C2 to C30 alkenyl group; C6 to C30 aryl group; C3 to C30 cycloalkyl group; C1 to C30 alkoxy group; a carboxyl group; R(C=O)—, R(C=O)O—, wherein R is a C1 to C30 alkyl group, C3 to C30 cycloalkyl group, or C6 to C30 aryl group; an epoxy group-containing monovalent organic group; (meth)acryl group; (meth)acrylate group; a C1 to C30 alkyl group substituted with a (meth)acryl group; a C1 to C30 alkyl group substituted with a (meth)acrylate group; or a combination thereof, Y is a C1 to C30 alkylene group, a C2 to C30 alkenylene group, a C3 to C30 cycloalkylene group, a C6 to C30 arylene group, or a combination thereof, $0 \leq M \leq 0.5$, $0 \leq D \leq 0.5$, $0 < T1 \leq 0.95$, $0 < T2 \leq 0.2$, $0 < Q \leq 0.9$, and $M+D+T1+T2+Q=1$, (b) an organic polymer having a boiling point of 100° C. to 200° C., (c) a surfactant represented by Chemical Formula 4:

[Chemical Formula 4]

wherein, in Chemical Formula 4, $R^a$ to $R^d$ are independently a C1 to C30 alkyl group, X is a halogen atom selected from F, Cl, Br, or I, and (d) a solvent, and wherein the organic polymer is present in an amount of 50 to 150 parts by weight based on 100 parts by weight of the carbosilane-siloxane copolymer.

15. The color conversion panel of claim 14, wherein the organic polymer is at least one selected from a polyalkylene oxide-based copolymer, a polyarylene oxide copolymer, and a glycol-based copolymer.

16. The color conversion panel of claim 14, wherein a number average molecular weight of the organic polymer ranges from 100 to 10,000.

17. The color conversion panel of claim 14, wherein the low refractive layer has a light transmittance of greater than or equal to 90% at 400 nm.

18. The color conversion panel of claim 14, wherein the color conversion panel further comprises at least one selected from:

a first capping layer covering the planarization layer; and a second capping layer disposed between the low refractive layer and the color conversion layer.

* * * * *